(12) United States Patent
Cao et al.

(10) Patent No.: US 8,823,437 B2
(45) Date of Patent: Sep. 2, 2014

(54) CLOCK SIGNAL GENERATOR

(71) Applicant: Huawei Technologies Co., Ltd., Shenzhen (CN)

(72) Inventors: Wei Cao, Shanghai (CN); Jindi Zhang, Shanghai (CN); Yingyan Shan, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 13/754,524

(22) Filed: Jan. 30, 2013

(65) Prior Publication Data

US 2013/0278302 A1 Oct. 24, 2013

(30) Foreign Application Priority Data

Apr. 20, 2012 (CN) .......................... 2012 1 0118178

(51) Int. Cl.
  *G06F 1/04* (2006.01)
  *H03L 7/099* (2006.01)
  *H03B 21/02* (2006.01)
  *H03L 7/18* (2006.01)
  *G06F 1/06* (2006.01)

(52) U.S. Cl.
  CPC .............. *H03B 21/02* (2013.01); *H03L 7/0995* (2013.01); *H03L 7/0998* (2013.01); *H03L 7/18* (2013.01); *G06F 1/06* (2013.01)
  USPC ............................ 327/295; 327/117; 327/293

(58) Field of Classification Search
  CPC .............. G06F 1/04; G06F 1/06; G06F 1/08; G06F 1/12
  USPC .................. 327/115, 117, 291, 293, 295, 296
  See application file for complete search history.

(56) References Cited

U.S. PATENT DOCUMENTS

| | | | |
|---|---|---|---|
| 5,077,686 A * | 12/1991 | Rubinstein | .................... 713/501 |
| 5,132,633 A | 7/1992 | Wong et al. | |
| 5,224,125 A | 6/1993 | Wong et al. | |
| 5,914,996 A * | 6/1999 | Huang | ............................ 377/39 |
| 7,084,679 B2 * | 8/2006 | Hartfiel et al. | ................. 327/141 |
| 7,804,341 B2 * | 9/2010 | Bazes | ............................ 327/156 |
| 7,913,103 B2 * | 3/2011 | Gold et al. | ..................... 713/501 |
| 8,578,193 B2 * | 11/2013 | Kim et al. | ..................... 713/322 |
| 2005/0174153 A1 | 8/2005 | Saeki | |

FOREIGN PATENT DOCUMENTS

| CN | 1655457 A | 8/2005 |
|---|---|---|
| CN | 200979669 Y | 11/2007 |

* cited by examiner

*Primary Examiner* — William Hernandez

(57) ABSTRACT

Embodiments of the present invention provide a clock signal generator, and the clock signal generator is applied to a physical layer subsystem supporting data transmission at multiple baud rates. The clock signal generator includes: a source clock signal generator, and two or more processors connected to an output end of the source clock signal generator; where the source clock signal generator outputs multiple source clock signals with the same frequency according to a reference signal of a reference clock in the subsystem; the processors perform frequency dividing processing on the multiple source clock signals through a digital logic circuit according to an oversampling technology, to obtain a synchronous clock signal corresponding to a baud rate of data transmission in the subsystem, so as to implement timing and transceiving functions when data is transmitted at the baud rate.

16 Claims, 9 Drawing Sheets ived in an embodiment of the present invention. As

CLOCK SIGNAL GENERATOR

CROSS-REFERENCE TO RELATED APPLICATION

This application claims priority to Chinese Patent Application No. 201210118178.7, filed on Apr. 20, 2012, which is hereby incorporated by reference in its entirety.

FIELD OF THE INVENTION

Embodiments of the present invention relate to the field of communications, and in particular, to a clock signal generator.

BACKGROUND OF THE INVENTION

In the current electronic system, industry insiders use a Gigabit Ethernet physical layer (Gigabit Ethernet Physical layer, GEPHY) or a fast Ethernet physical layer (Fast Ethernet Physical layer, FEPHY) to refer to a circuit unit of its corresponding layer.

Generally, the GEPHY/FEPHY must include a clock generator, which is used for implementing functions such as timing and transceiving of data code streams at various transmission rates. The current clock generator of the GEPHY/FEPHY needs to cover clock signals needed at two transmission rates such as 125 MBaud (Baud) and 10 MBaud.

The clock generator disposed in the existing GEPHY/FEPHY and capable of covering the foregoing two transmission rates includes: two phase-lock loop circuits and multiple analog mixer circuits, where the two phase-lock loop circuits are disposed in parallel, and an output end of each phase-lock loop circuit is connected to an adapted analog mixer circuit, so as to output a clock signal suitable for a 125 Mbaud/10 Mbaud transmission rate through an output end of the analog mixer circuit.

However, in the existing technical solutions, multiple phase-lock loop circuits and multiple analog mixers are included, so power consumption is high and a larger chip area needs to be occupied, thereby not facilitating miniaturization of the chip and reduction of the cost of the whole chip.

SUMMARY OF THE INVENTION

Embodiments of the present invention provide a clock signal generator, so as to solve the problem of high power consumption and a large occupied area of a clock generator in the prior art.

An embodiment of the present invention provides a clock signal generator, where the clock signal generator is applied to a physical layer subsystem supporting data transmission at multiple baud rates, and includes:

a source clock signal generator, and two or more processors connected to an output end of the source clock signal generator, where the source clock signal generator outputs multiple source clock signals with the same frequency according to a reference signal of a reference clock in the subsystem; and the processors perform frequency dividing processing on the multiple source clock signals through a digital logic circuit according to an oversampling technology, to obtain a synchronous clock signal corresponding to a baud rate of data transmission in the subsystem, so as to implement timing and transceiving functions when data is transmitted at the baud rate.

An embodiment of the present invention provides a chip, where the chip includes a crystal oscillator generating a reference signal, and further includes the clock signal generator according to the foregoing content;

the crystal oscillator is connected to an input end of a source clock signal generator of the clock signal generator, and is configured to provide a reference signal for the source clock signal generator.

It can be known from the foregoing technical solutions that, in a clock signal generator provided in the embodiments of the present invention, multiple source clock signals with the same frequency are output by a source clock signal generator; then processors perform frequency dividing processing on the multiple source clock signals through a digital logic circuit according to an oversampling technology, to obtain a synchronous clock signal corresponding to a baud rate of data transmission in a subsystem, so as to implement timing and transceiving functions when data is transmitted at the baud rate. Compared with the prior art, the clock signal generator provided in the embodiments of the present invention only uses one set of phase-lock loop circuits, and uses an all-digital logic circuit rather than an analog circuit such as a mixer, which greatly simplifies the design of the clock signal generator, so that the size of a chip containing the clock signal generator can be further decreased, thereby reducing the cost and meanwhile decreasing the overall power consumption.

DETAILED DESCRIPTION OF THE EMBODIMENTS

Figure 1:
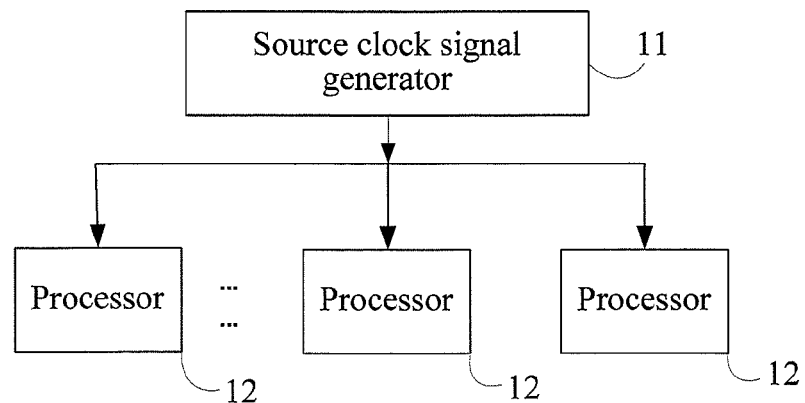
FIG. 1 is a schematic diagram of a clock signal generator provided in an embodiment of the present invention.

FIG. 1 is a schematic diagram of a clock signal generator provided in an embodiment of the present invention. As shown in FIG. 1, the clock signal generator in this embodiment is applied to a physical layer subsystem supporting data transmission at multiple baud rates, and includes: a source clock signal generator 11, and two or more processors 12 connected to an output end of the source clock signal generator 11.

The source clock signal generator 11 outputs multiple source clock signals with the same frequency according to a reference signal of a reference clock in the physical layer subsystem.

The processors 12 perform frequency dividing processing on the multiple source clock signals through a digital logic circuit according to an oversampling technology, to obtain a synchronous clock signal corresponding to a baud rate of data transmission in the subsystem, so as to implement timing and transceiving functions when data is transmitted at the baud rate.

A digital logic circuit in this embodiment is located in a processor. Specifically, a partial structure or a whole structure of the digital logic circuit is shown in FIG. 3, FIG. 5, FIG. 6, FIG. 8, and FIG. 9 through examples.

For example, the clock signal generator in this embodiment is located on a certain chip, and there are two baud rates of data transmission, such as 125 MBaud and 10 MBaud, in the chip. At this time, there are two processors in the clock signal generator, and each processor connected to the source clock signal generator obtains a synchronous clock signal corresponding to a baud rate of data transmission in the subsystem, so as to implement timing and transceiving functions when data is transmitted at the baud rate.

In the clock signal generator of this embodiment, a source clock signal generator outputs multiple source clock signals with the same frequency; then processors process the multiple source clock signals through a digital logic circuit according to an oversampling technology, to obtain a synchronous clock signal corresponding to a baud rate of data transmission in the subsystem.

Figure 2:
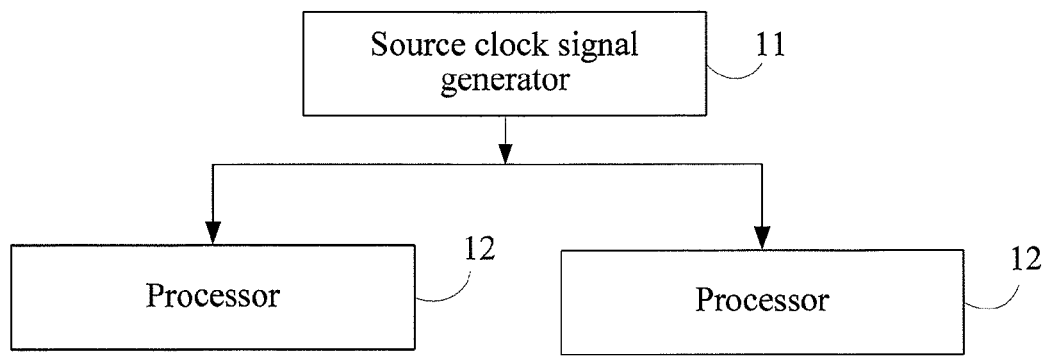
FIG. 2 is a schematic diagram of a clock signal generator provided in another embodiment of the present invention.

In another embodiment, as shown in FIG. 2, a clock signal generator of this embodiment includes a source clock signal generator 11 and two processors 12.

Of course, in an actual application, data transmission at 125 MBaud and 10 MBaud may support a speed level of 1000BASE-T/100BASE-TX/10BASE-T in a system where a GEPHY is located; and furthermore, the data transmission at 125 MBaud and 10 MBaud further supports a speed level of 100BASE-TX/10BASE-T in a system where an FEPHY is located.

Therefore, in this embodiment, a source clock signal generator 11 and two parallel processors 12 including a data logic circuit are disposed; one processor 12 outputs a synchronous clock signal corresponding to 125 MBaud rate of data transmission in the subsystem through an internal digital logic circuit, and the other processor 12 outputs a synchronous clock signal corresponding to 10 MBaud rate of data transmission in the subsystem through an internal digital logic circuit. In this way, a cost can be greatly saved in manufacturing the clock signal generator, and meanwhile, the area occupied by the clock signal generator in a chip can be decreased.

Specifically, adopting the clock signal generator to output a first clock signal suitable for 125 MBaud rate of data transmission and a second clock signal suitable for 10 MBaud rate of data transmission in the subsystem is as described below.

Figure 3:
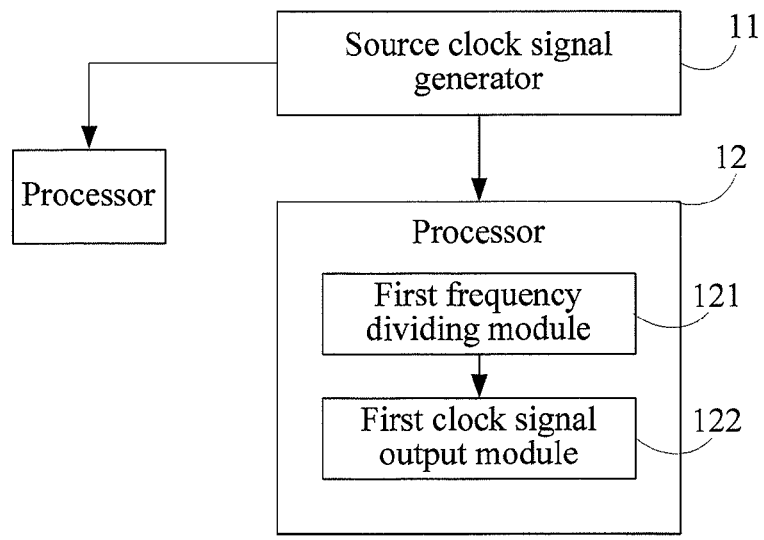
FIG. 3 is a schematic diagram of a processor of a clock signal generator provided in another embodiment of the present invention.

FIG. 3 is a schematic diagram of a processor of a clock signal generator provided in another embodiment of the present invention. As shown in FIG. 3, when a baud rate of data transmission in a subsystem is 125 MBaud, the forgoing source clock signal generator 11 is specifically configured to generate eight source clock signals with the frequency of 1 Ghz according to a reference signal, where among the source clock signals, a phase interval between any two adjacent source clock signals is 125 ps.

Correspondingly, the processor in this embodiment specifically includes: a first frequency dividing module 121, and a first clock signal output module 122 connected to the first frequency dividing module 121.

The first frequency dividing module 121 is configured to perform beat processing on each source clock signal of the eight source clock signals output by the source clock signal generator, to obtain 64 first clock signals, where each source clock signal is corresponding to eight first clock signals, and a phase interval between any two adjacent first clock signals among the eight first clock signals is 1 ns.

The first clock signal output module 122 selects, according to a preset control signal in the physical layer subsystem, a first clock signal from all the first clock signals obtained by the first frequency dividing module, and uses the selected first clock signal as a synchronous clock signal with a 125 MBaud data code stream in the subsystem.

For example, the source clock signal generator of this embodiment includes: a phase-lock loop circuit; the first frequency dividing module includes: eight eight-frequency dividing circuits connected in parallel, where each eight-frequency dividing circuit performs frequency dividing processing on a source clock signal which has a frequency of 1 Ghz and is output by the source clock signal generator, to obtain eight first clock signals with a frequency of 125 Mhz.

Figure 4:
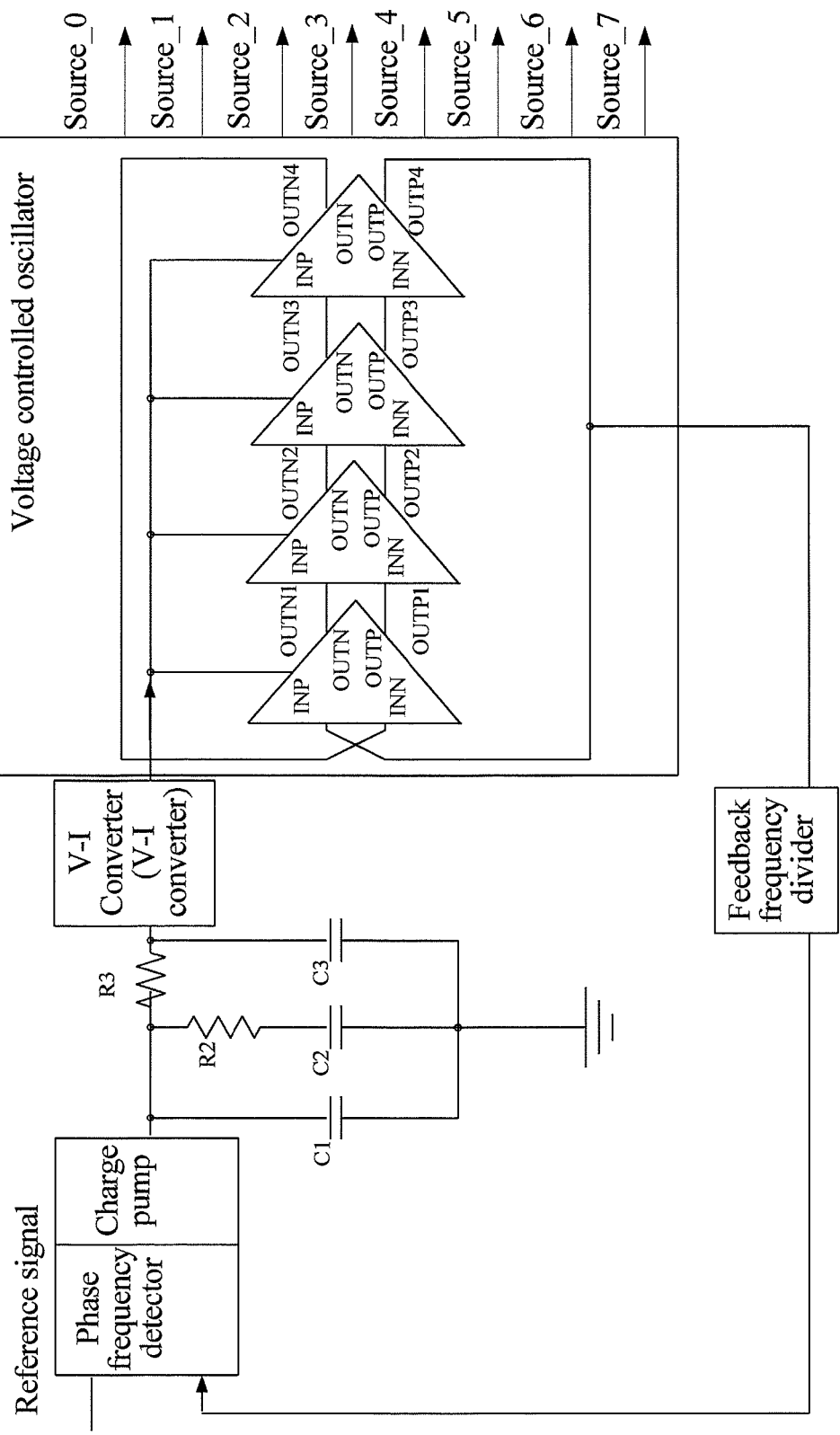
FIG. 4 is a schematic diagram of a phase-lock loop circuit of a clock signal generator provided in another embodiment of the present invention.

FIG. 4 is a schematic diagram of a phase-lock loop circuit used in a clock signal generator provided in an embodiment of the present invention. As shown in FIG. 4, the phase-lock loop of this embodiment includes circuit elements such as a phase frequency detector (Phase Frequency Detector, PFD), a charge pump (Charge Pump, CP), a voltage controlled oscillator (Voltage Controlled Oscillator, VCO), and a feedback frequency divider, where the voltage controlled oscillator outputs eight source clock signals (source_0, source_1, source_2, source 3, source_4, source_5, source_6, source_7) with a frequency of 1 Ghz.

The PFD and the CP are mainly configured to convert a phase error signal between a reference signal and a signal fed back by the feedback frequency divider into a current signal. Circuit elements $R_2$, $R_3$, $C_1$, $C_2$, and $C_3$ in FIG. 4 form a loop filter, configured to filter the current signal, so as to output a voltage signal after the filtered current signal passes through a V-I converter (such as integral conversion), so that the VCO outputs the eight source clock signals with a frequency of 1 Ghz, where a phase difference between two adjacent source clock signals is 125 ps (for example, the phase difference between source_1 and source_2 is 125 ps). The forgoing feedback frequency divider is configured to perform frequency dividing on the source clock signals output by the VCO and feed back signals obtained after the frequency dividing to the phase frequency detector.

Particularly, the voltage controlled oscillator shown in FIG. 4 is formed by a 4-level differential circuit, and may output eight uniform source clock signals with a frequency of 1 Ghz.

It should be noted that, an interval between rising edges of any two adjacent signals (for example, between the rising edge of source_1 and the rising edge of source_2) among the forgoing source clock signals is 125 ps.

Of course, the phase-lock loop circuit of this embodiment may be any phase-lock loop circuit in the prior art, as long as it can output a source clock signal with a frequency and a phase that are suitable for the subsequent processor. The structure of the phase-lock loop circuit shown in FIG. 4 is not limited to this embodiment.

Compared with the prior art, the clock signal generator provided in this embodiment uses only one set of phase-lock loop circuits, and uses an all-digital logic circuit rather than an analog circuit such as a mixer, which greatly simplifies the design of the clock signal generator, so that the size of a chip containing the clock signal generator can be further decreased, thereby reducing a cost and meanwhile decreasing the overall power consumption.

Figure 5:
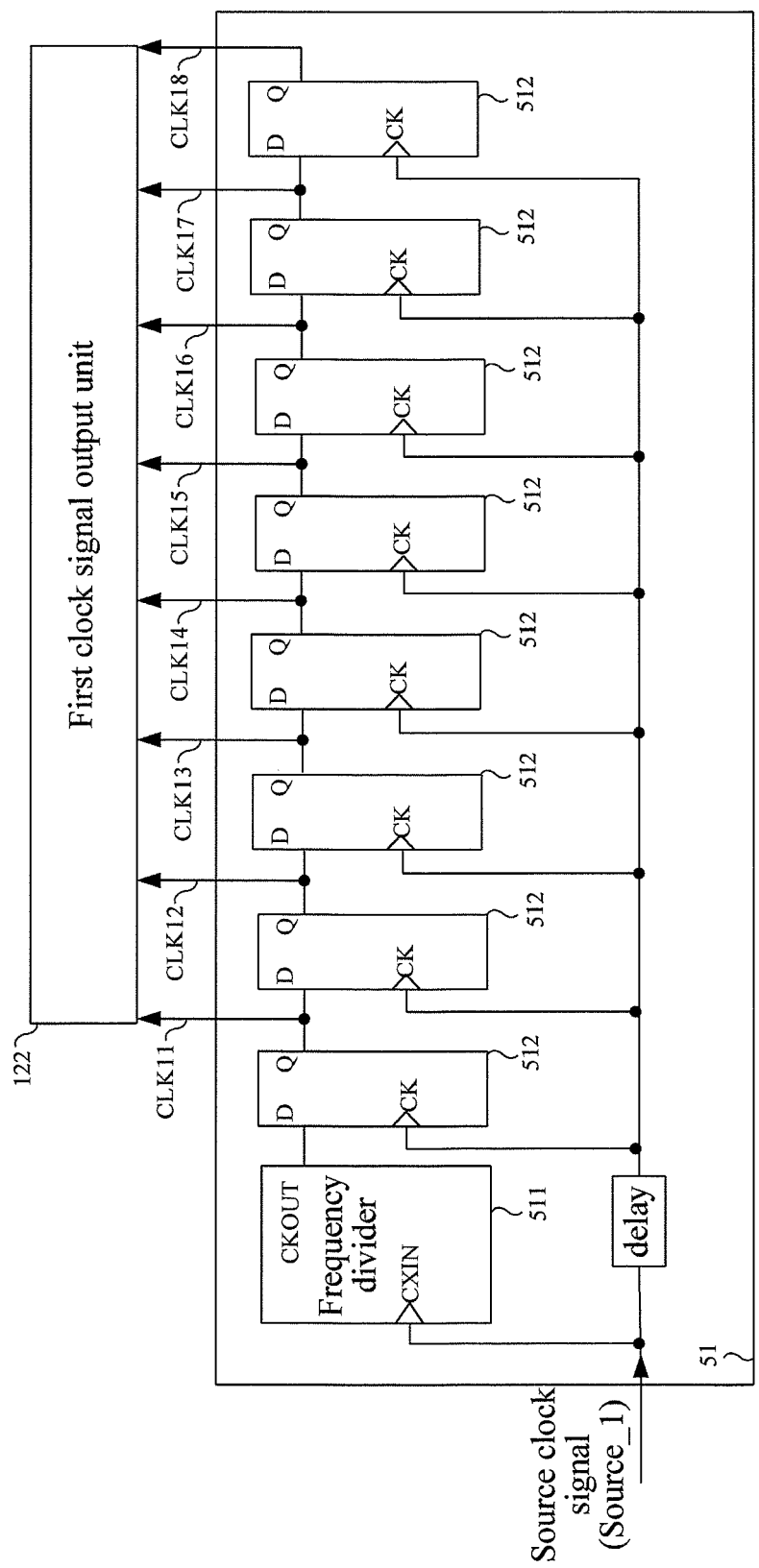
FIG. 5 is a schematic diagram of an eight-frequency dividing circuit of a clock signal generator provided in another embodiment of the present invention.

As shown in FIG. 5, FIG. 5 is a schematic diagram of an eight-frequency dividing circuit used in a clock signal generator provided in another embodiment of the present invention. It should be noted that, an input signal of the eight-frequency dividing circuit of this embodiment is a source clock signal (for example, source_1 shown in FIG. 4) output by a source clock signal generator 11. That is, an input end of the eight-frequency dividing circuit is connected to an output end of the source clock signal generator 11, and an output end of the eight-frequency dividing circuit is connected to an input end of the first clock signal output module 122 (as shown in FIG. 3).

The eight-frequency dividing circuit shown in FIG. 5 is only an example for illustrating a partial circuit in the first frequency dividing module, and actually, the first frequency dividing module includes eight parallel eight-frequency dividing circuits.

The eight-frequency dividing circuit 51 of this embodiment includes a frequency divider 511 and eight D triggers 512, where the eight D triggers are connected in series, and form a D trigger array; and a source clock signal output by the source clock signal generator is input into an input end of the frequency divider and a clock signal input end of each D trigger of the eight D triggers; and an output end of the frequency divider 511 is connected to an input end of the D trigger array; and an output end of each D trigger of the eight D triggers is connected to a first clock signal output module 122, so as to output the forgoing first clock signals.

That is to say, the input end of the frequency divider 511 is connected to a source clock signal (for example, source_1) output by the source clock signal generator 11, and the output end of the frequency divider 511 is connected to a clock signal input end D of the eight D triggers 512.

An input end CP of the D trigger array, namely, the eight D triggers 512, is connected to an output end of the source clock signal generator, that is, the input end CP of the D trigger array receives the source clock signals (for example, source_0 to source_7) input into the frequency divider 511.

An output end Q of each D trigger 512 of the eight D triggers 512 outputs the first clock signals, and a phase interval between any two adjacent first clock signals among the eight first clock signals is 1 ns.

Specifically, the 64 first clock signals output by the D trigger array are shown in the following table.

| Source clock signals | First clock signals | | | | | | | |
|---|---|---|---|---|---|---|---|---|
| Source_0 | CLK01 | CLK02 | CLK03 | CLK04 | CLK05 | CLK06 | CLK07 | CLK08 |
| Source_1 | CLK11 | CLK12 | CLK13 | CLK14 | CLK15 | CLK16 | CLK17 | CLK18 |
| Source_2 | CLK21 | CLK22 | CLK23 | CLK24 | CLK25 | CLK26 | CLK27 | CLK28 |
| Source_3 | CLK31 | CLK32 | CLK33 | CLK34 | CLK35 | CLK36 | CLK37 | CLK38 |
| Source_4 | CLK41 | CLK42 | CLK43 | CLK44 | CLK45 | CLK46 | CLK47 | CLK48 |
| Source_5 | CLK51 | CLK52 | CLK53 | CLK54 | CLK55 | CLK56 | CLK57 | CLK58 |
| Source_6 | CLK61 | CLK62 | CLK63 | CLK64 | CLK65 | CLK66 | CLK67 | CLK68 |
| Source_7 | CLK71 | CLK72 | CLK73 | CLK74 | CLK75 | CLK76 | CLK77 | CLK78 |

In the table, a phase difference between two horizontal adjacent first clock signals is 1 ns, for example, a phase difference between CLK02 and CLK03 is 1 ns; and a phase difference between two longitudinal adjacent first clock signals is 125 ps, for example, a phase difference between CLK14 and CLK24 is 125 ps, and frequencies of the 64 first clock signals are all 125 Mhz.

It should be noted that, "delay" shown in FIG. 5 is a delayer that may be disposed in a simulation experiment according to an actual demand.

Figure 6:
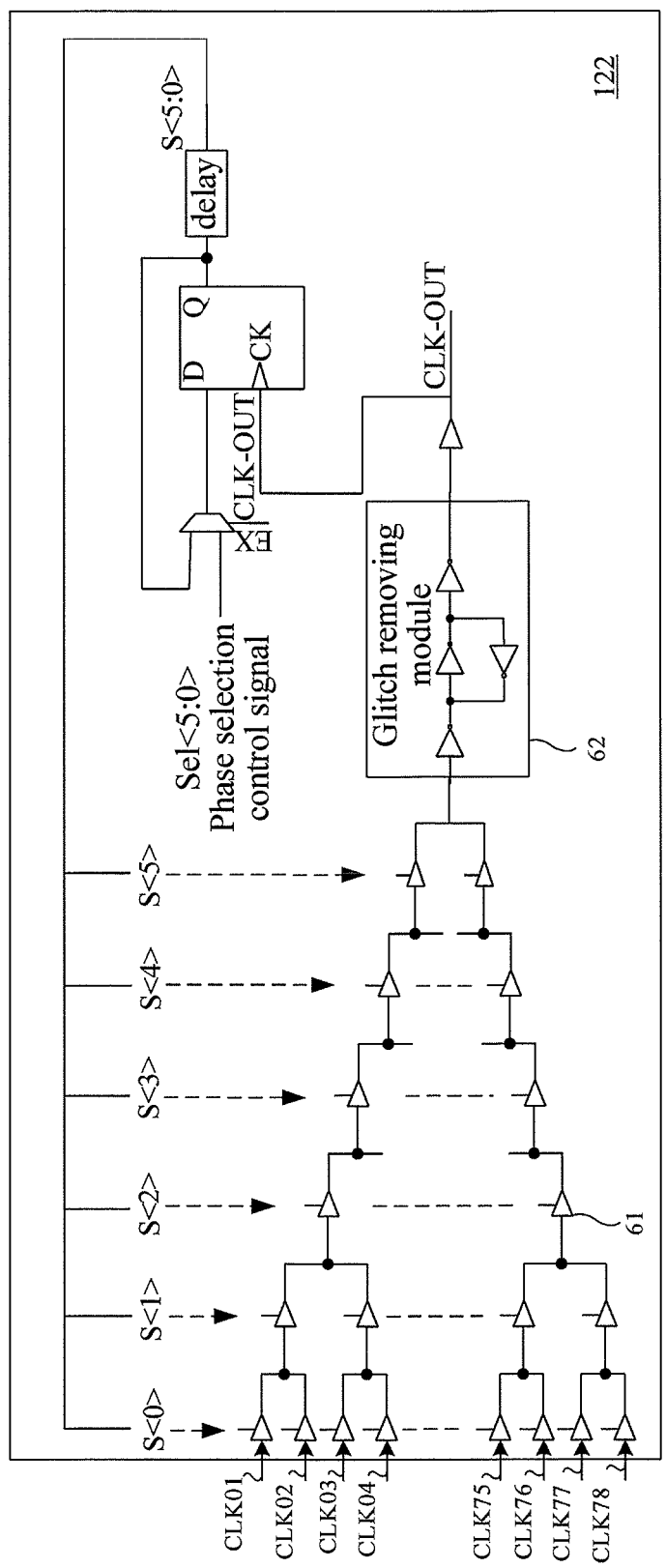
FIG. 6 is a schematic diagram of a first clock signal output module of a clock signal generator provided in another embodiment of the present invention.

FIG. 6 is a schematic diagram of a first clock signal output module used in a clock signal generator provided in another embodiment of the present invention. As shown in FIG. 6, in this embodiment, the first clock signal output module 122 includes: multiple phase inverters 61 with a gating function, where the multiple phase inverters 61 are connected in a Pyramid structure, and each phase inverter receives a control signal preset in the subsystem or receives a control signal (for example, Sel <5:0> below) sent by another circuit element in the subsystem. When the control signal is in a high level, the phase inverter outputs a first clock signal received by an input end of the phase inverter, and then the first clock signal output module selects, according to the control signal in the forgoing physical layer subsystem, a first clock signal from 64 first clock signals output by a first frequency dividing module. Generally, with respect to each phase inverter, industry insiders call the control signal "an enable signal" of the phase inverter.

It should be noted that, the number of phase inverters in the Pyramid structure decreases from left to right progressively according to $2^6$-$2^5$-$2^4$-$2^3$-$2^2$-$2^1$-$2^0$.

Of course, in other embodiments, the multiple phase inverters in the first clock signal output module 122 may also be arranged in other manners. This embodiment does not limit the number of the phase inverters and the arrangement of the phase inverters, as long as a first clock signal corresponding to 125 MBaud rate of data transmission can be selected from the 64 first clock signals by virtue of the arranged multiple phase inverters and through the control signal in the physical layer subsystem.

Selecting one first clock signal from the 64 first clock signals for output can satisfy a performance requirement of a system where a GEPHY is located, and meanwhile can also reduce a precision requirement on a single phase. Particularly, for a latest IEEE distortion standard for a data code stream, it can be guaranteed that the design still has considerable redundancy in the worst situation.

As shown in FIG. 6, the system where the GEPHY/FEPHY is located outputs a phase selection control signal such as Sel <5:0>; then, according to the control signal Sel <5:0> and control signals such as S<0>, S<1>, S<2>, S<3>, S<4> and S<5> (S<5:0> for short) in FIG. 6 that are output by the D trigger with reference to the output CLK-OUT, the first clock signal corresponding to 125 MBaud rate of data transmission is selected.

The control signal is set by the system where the GEPHY/FEPHY is located in an actual application.

Preferably, in FIG. 6, a glitch removing module 62 is further added at a CLK-OUT output side, and is configured to perform processing on the glitch of a pre-output CLK-OUT, so as to output a first clock signal without a glitch.

In this way, in the foregoing clock signal generator, multiple source clock signals are generated through a phase-lock loop circuit, and the multiple source clock signals pass through the first frequency dividing module and the first clock signal output module, to output a first clock signal corresponding to 125 MBaud rate of data transmission, which greatly simplifies the design of the clock signal generator, so that the size of a chip containing the clock signal generator can be further decreased, thereby reducing a cost and meanwhile decreasing the overall power consumption.

Figure 7:
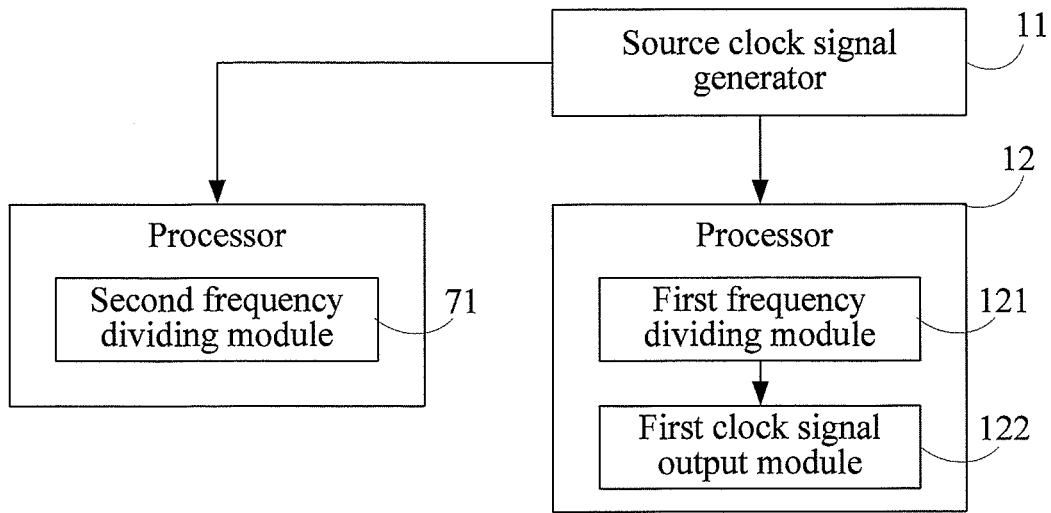
FIG. 7 is a schematic diagram of a clock signal generator provided in another embodiment of the present invention.

In addition, in another embodiment, as shown in FIG. 7, when a baud rate of data transmission in a physical layer subsystem is 10 MBaud, a source clock signal generator is specifically configured to generate eight source clock signals with a frequency of 1 Ghz according to a reference signal. In all the source clock signals, a phase interval between any two adjacent source clock signals is 125 ps. The source clock signal generator of this embodiment may be a phase-lock loop circuit shown in FIG. 4.

In this embodiment, a processor specifically includes: a second frequency dividing module 71, configured to perform selective beat processing on the eight source clock signals output by the source clock signal generator, and use a second clock signal obtained after the beat processing as a synchronous clock signal corresponding to a 10 MBaud data code stream in the subsystem.

In this embodiment, a second frequency dividing module 71 includes a 25/4 frequency dividing circuit, where the 25/4 frequency dividing circuit is specifically configured to perform frequency dividing processing on 25 clock periods of 5 source clock signals with a frequency of 1 Ghz and obtain second clock signals of four periods with a frequency of 160 Mhz.

Specifically, FIG. 8, FIG. 9, FIG. 10A, FIG. 10B, FIG. 10C, FIG. 10D, and FIG. 11 show a circuit structure of a second frequency dividing module of this embodiment in an exploded manner.

Figure 8:
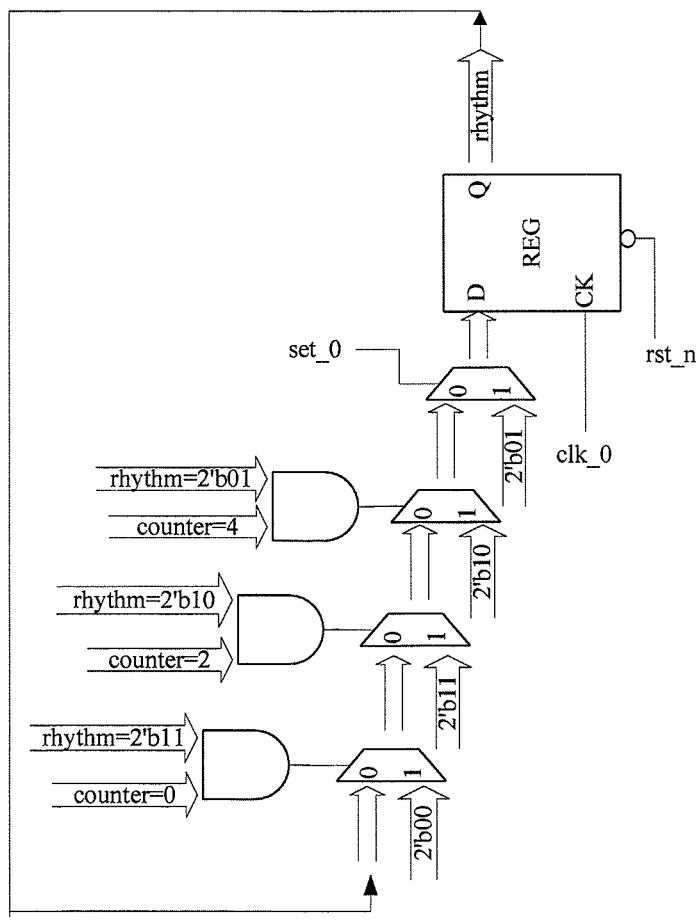
FIG. 8 is a partial schematic structural diagram of a second frequency dividing module of a clock signal generator provided in another embodiment of the present invention.

FIG. 8 is a circuit diagram of a beat generator output at 2 bits. The beat generator shown in FIG. 8 is configured to control the generation time of the four 160 Mhz second clock signals, and the corresponding beat output may be rhythm <1:0> shown in FIG. 8. With reference to a sequence diagram in FIG. 11, rhythm <1:0> is corresponding to 2'b00, 2'b01, 2'b10, and 2'b11.

Periods of 2'b00, 2'b01, 2'b10, and 2'b11 are 7 ns, 6 ns, 6 ns, 6 ns, respectively.

In FIG. 8, it should be noted that, "rhythm" in FIG. 8 indicates a name of an output signal of the beat generator, with a width being 2 bits, and values of the "rhythm" may be 2'b00, 2'b01, 2'b10 and 2'b11 to mark four periods. "Counter" is the output of a 3-bit counter, which is used for assisting the beat generator in controlling generation of each beat.

Figure 10A:
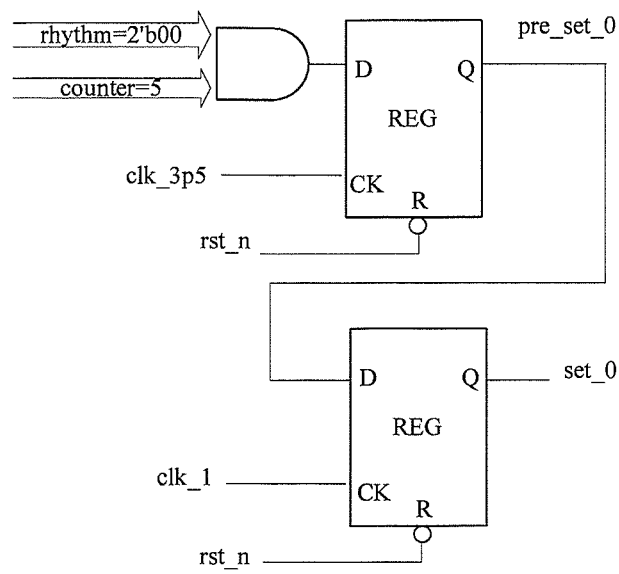
FIG. 10A to FIG. 10D are partial schematic structural diagrams of a second frequency dividing module of a clock signal generator provided in another embodiment of the present invention.

A signal set_0 in FIG. 8 is a signal output in FIG. 10A. rst_n is an asynchronous reset signal output by a system where the GEPHY/FEPHY is located.

Figure 9:
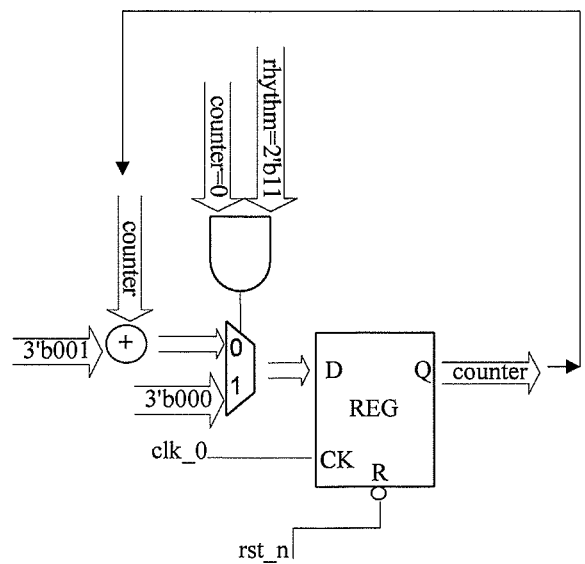
FIG. 9 is a partial schematic structural diagram of a second frequency dividing module of a clock signal generator provided in another embodiment of the present invention.

FIG. 9 is a circuit diagram of a 3-bit (bit) counter. Because clocks of four periods with a frequency of 160 Mhz are generated among the periods 7 ns, 6 ns, 6 ns, and 6 ns (25 ns in total), the counter forms 25 beats by adding one reset signal 3'b000 to three 8-beat parts, and then obtains a 25 ns counting period.

Figure 10B:
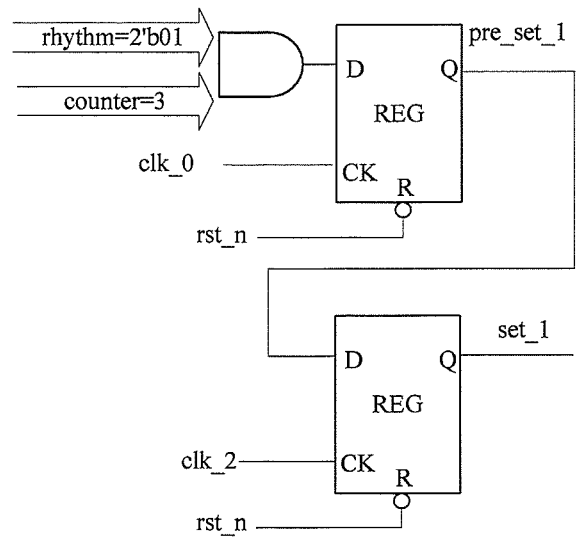
Figure 10C:
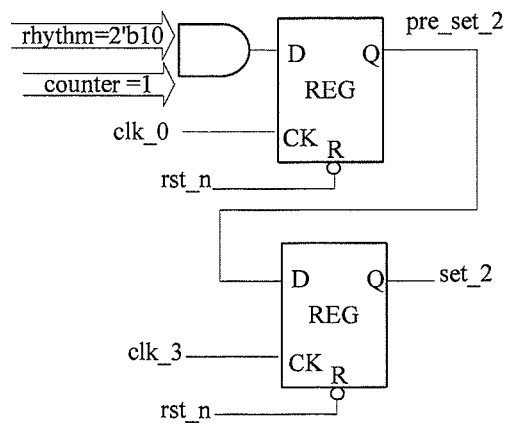
Figure 10D:
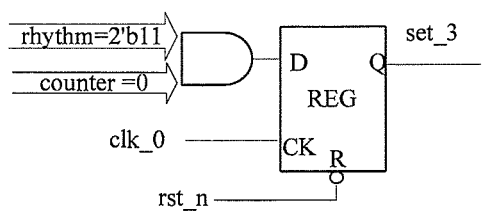

FIG. 10A to FIG. 10B show circuit structures of generating set signals (such as set_0, set_1, set_2, and set_3). It should be understood that, a frequency of a source clock signal of this embodiment is 1 Ghz, so the set signals (such as set_0, set_1, set_2 and set_3) in the FIG. 10A to FIG. 10D are generated by virtue of a series of "preset" signals.

In FIG. 10A to FIG. 10D, the signals pre_set_0~2 are "preset" signals, and the signals set_0~3 are set signals. clk_1 is a 1 Ghz clock whose phase (a clock rising edge) lags behind that of clk_0 by 250 ps; a phase of clk_2 lags behind that of clk_1 by 250 ps; a phase of clk_3 lags behind that of clk_2 by 250 ps; and a phase of clk_3p5 lags behind that of clk_3 by 125 ps. They all indicate source clock signals with a frequency of 1 Ghz.

In addition, correspondence between clk_0, clk_1, clk_2, clk_3, clk_3p5 shown in FIG. 9 to FIG. 11 and the source clock signals is shown in the table below.

| clk_0 | clk_1 | clk_2 | clk_3 | clk_3p5 |
|---|---|---|---|---|
| Source_0 | Source_2 | Source_4 | Source_6 | Source_7 |

A phase difference between adjacent signals of clk_0, clk_1, clk_2, and clk_3 is 250 ps, and a phase difference between clk_3 and clk_3p5 is 125 ps.

For convenience of illustration, in FIG. 8 to FIG. 11, clk_0, clk_1, clk_2, clk_3, and clk_3p5 are used to indicate the input of the source clock signals.

FIG. 10A to FIG. 10D are circuit diagrams illustrating the control of generation of a rising edge of a 160 Mhz second clock signal. The rhythm <1:0> is corresponding to 2'b00, 2'b01, 2'b10, and 2'b11; periods are 7 ns, 6 ns, 6 ns, and 6 ns, and the period of the 160 Mhz second clock signal is 25/4=6.25 ns. Therefore, each rising edge of the 160 Mhz clock needs to be further delayed by 250 ps on the basis of the 6 ns period in rhythm <1:0>. That is, a clock lagging behind the previous clock generating a control set signal by 250 ps is used to generate a current set signal.

For example, when rhythm <1:0> is corresponding to 2'b00, clk_1 controls set_0 to generate a rising edge of the 160 Mhz second clock signal; and the rest may be done by analogy:

when rhythm <1:0> is corresponding to 2'b01, clk_2 controls set_1 to generate a rising edge of the 160 Mhz second clock signal;

when rhythm <1:0> is corresponding to 2'b10, clk_3 controls set_2 to generate a rising edge of the 160 Mhz second clock signal; and when rhythm <1:0> is corresponding to 2'b11, clk_0 controls set_3 to generate a rising edge of the 160 Mhz second clock signal.

Correspondingly, in FIG. 10A to FIG. 10D, set_low_0, set_low_1, set_low_2, and set_low_3 (set_low_0~3 for short) are control signals of a falling edge of the 160 Mhz second clock signal, where set_0 is corresponding to set_ low_0, set_1 is corresponding to set_low_1, set_2 is corresponding to set_low_2, and set_3 is corresponding to set_low_3.

In addition, it should be noted that, the beat generator shown in FIG. 8 and the counter shown in FIG. 9 both use clk_0.

The set signals set_0, set_1, set_2, and set_3 (set_0~3 for short), and set_low_0~3 change from a low level to a high level, and maintains at the high level merely for the pulse period of ins, and then change to a low level.

Figure 11:
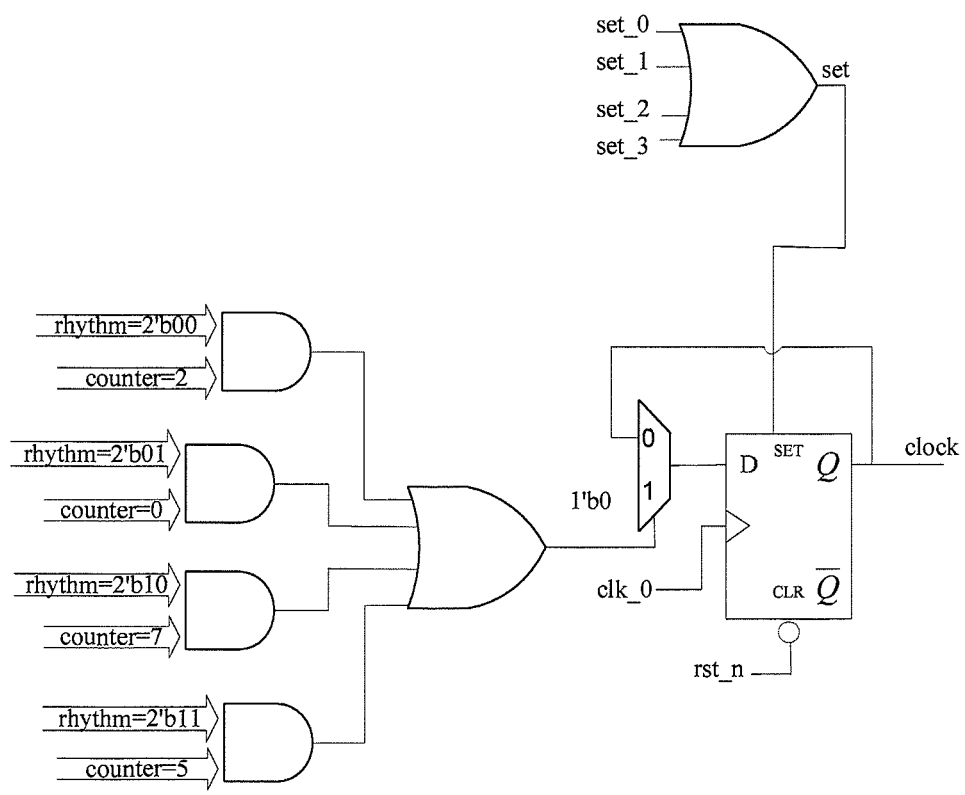
FIG. 11 is a partial schematic structural diagram of a second frequency dividing module of a clock signal generator provided in another embodiment of the present invention.
Figure 12:
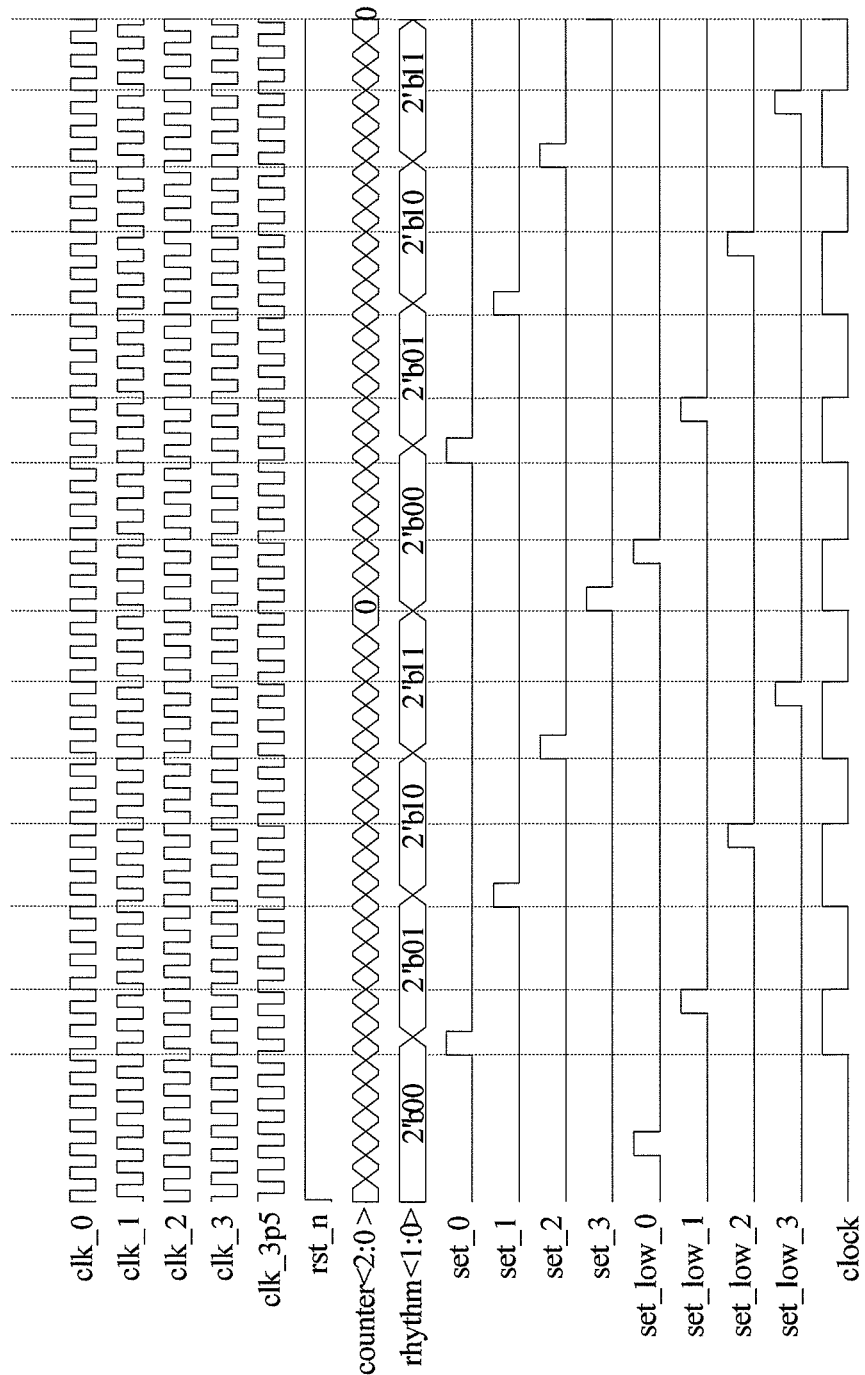
FIG. 12 is a schematic diagram of a signal of a second frequency dividing module of a clock signal generator provided in another embodiment of the present invention.

FIG. 12 shows a relationship diagram of signals, and with reference to FIG. 8 to FIG. 12, a working process of a 25/4 frequency dividing circuit is simply illustrated below.

When rst_n is in a low level, the entire circuit is in a reset state, the output of a D trigger in FIG. 11 is 0, so the output of rhythm <1:0> shown in FIG. 8 is 2'b00; the output of the counter shown in FIG. 9 is also 0; set_0~3 and set_low_0~3 shown in FIG. 10A to FIG. 10D are also 0. At this time, the output of the clock is also 0.

When rst_n changes from a low level to a high level, the counter (counter) shown in FIG. 9 starts to count. After the counter counts to 5, pre_set_0 in FIG. 10A changes to a high level after a clk3$p$5 rising edge is reached. When a next clk_1 rising edge is reached, set_0 changes to a high level, so that the D trigger in FIG. 11 is set, and the output of the clock changes from a low level to a high level. In addition, it can be seen from FIG. 11 that, set_low_0~3 at this time are all in a low level, so the clock continues to maintain a high level.

When set_0 changes to a high level, rhythm <1:0> in FIG. 8 changes from 2'b00 to 2'b01 and maintains unchanged when a next clk_0 rising edge is reached. The counter shown in FIG. 9 continues to count, till the value on the counter is changed to 0, set_low_1 changes to a high level, so that an input signal D of the D trigger in FIG. 11 changes from a high level to a low level; therefore, when a next clk_0 rising edge is reached, the output of the clock changes from a high level to a low level and maintains the low level unchanged.

The counter shown in FIG. 9 continues to count, when the counter counts to 3, pre_set_1 in FIG. 10B changes to a high level when a next clk_0 rising edge is reached, and meanwhile set_1 changes to a high level when a high level of clk_2 is reached, so that the set signal in FIG. 11 changes to a high level, the clock changes from a low level to a high level again, and a new period of the 160 Mhz clock is started.

Meanwhile, when pre_set_1 changes to a high level, the counter shown in FIG. 9 counts to 4, and when a next clk_0 rising edge is reached, rhythm<1:0> in FIG. 8 changes from 2'b01 to 2'b10. In such a process, the counter in FIG. 9 continues to count from 0 to 7 circularly and repeatedly.

When the counter counts to 7, set_low_2 changes to a low level, and when a next clk_0 rising edge is reached, the output of the clock changes from a high level to a low level.

The rest may be done by analogy; set_low_0~3 changes to a high level, so that the clock changes from a high level to a low level and maintains unchanged, and until set_0~3 changes to a high level, a set operation is performed for the D trigger in FIG. 11, so that the clock changes from a low level to a high level. To sum up, through logic processing by the counter in FIG. 9 and rhythm <1:0> in FIG. 8, set_0~3 and set_low_0~3 are generated, so as to control the generation of the rising edge and the falling edge of a 160M clock, thereby generating the 160M clock.

In this way, second clock signals of four periods with a frequency of 160 Mhz may be obtained through the 25/4 frequency dividing circuit, and the foregoing circuit can guarantee that a deviation is updated once each four periods. The 160 Mhz clock is provided for a subsystem where the GEPHY/FEPHY for processing 10 MBaud rate of data transmission is located, so as to implement timing and transceiving functions when data is transmitted at the baud rate. The processor outputting the second clock signal also takes advantages of the "oversampling technology", thereby guaranteeing desirable signal-to-noise ratio performance, and meanwhile reducing a cost, for example, the processor shares the same phase-lock loop circuit with a processor outputting the first clock signal. Furthermore, the area occupied by the clock signal generator in the chip is decreased.

According to another aspect of the present invention, an embodiment of the present invention further provide a chip, where the chip includes a crystal oscillator generating a reference signal, and the chip further includes a clock signal generator according to any embodiment described above.

The crystal oscillator is connected to an input end of a source clock signal generator of the clock signal generator, and is configured to provide a reference signal for the source clock signal generator.

Persons of ordinary skill in the art should understand that, all or a part of the circuit in the embodiments may be formed by digital logic elements. The foregoing program for controlling the digital logic elements may be stored in a computer readable storage medium, such as a ROM, a RAM, a magnetic disk, or an optical disk.

Finally, it should be noted that the foregoing embodiments are merely intended for describing the technical solutions of the present invention, other than limiting the present invention. Although the present invention is described in detail with reference to the foregoing embodiments, persons of ordinary skill in the art should understand that they may still make modifications to the technical solutions described in the foregoing embodiments, or make equivalent substitutions to some or all the technical features thereof, without departing from the idea and scope of the technical solutions of the embodiments of the present invention.

What is claimed is:

1. A clock signal generator, applied to a physical layer subsystem supporting data transmission at multiple baud rates, the clock signal generator comprising:
    a source clock signal generator, and two or more processors connected to an output end of the source clock signal generator, wherein
    the source clock signal generator outputs multiple source clock signals with the same frequency according to a reference signal of a reference clock in the subsystem; and
    the processors perform frequency dividing processing on the multiple source clock signals through a digital logic circuit according to an oversampling technology, to obtain a synchronous clock signal corresponding to a baud rate of data transmission in the subsystem, so as to implement timing and transceiving functions when data is transmitted at the baud rate.

2. The clock signal generator according to claim 1, wherein when the baud rate of data transmission in the subsystem is 125 MBaud:
    the source clock signal generator is configured to generate eight source clock signals with a frequency of 1 Ghz according to the reference signal, wherein among the source clock signals, a phase interval between any two adjacent source clock signals is 125 ps;
    correspondingly, the processor comprises: a first frequency dividing module, and a first clock signal output module connected to the first frequency dividing module, wherein the first frequency dividing module performs beat processing on each source clock signal of the eight source clock signals output by the source clock signal generator to obtain 64 first clock signals, wherein each source clock signal corresponds to eight first clock signals, and a phase interval between any two adjacent first clock signals among the eight first clock signals is 1 ns; and the first clock signal output module selects, according to a control signal preset in the subsystem, a first clock signal from all the first clock signals obtained by the first frequency dividing module, and uses the selected first clock signal as a synchronous clock signal with a 125MBaud data code stream in the subsystem.

3. The clock signal generator according to claim 2, wherein the first frequency dividing module comprises:

eight eight-frequency dividing circuits connected in parallel, wherein each of the eight-frequency dividing circuit performs frequency dividing processing on a source clock signal that has a frequency of 1 Ghz and is output by the source clock signal generator, to obtain eight first clock signals with a frequency of 125 Mhz.

4. The clock signal generator according to claim 3, wherein each of the eight eight-frequency dividing circuits comprises:

a frequency divider and eight D triggers, wherein the eight D triggers are connected in series, and form a D trigger array; and a source clock signal output by the source clock signal generator is input into an input end of the frequency divider and a clock signal input end of each D trigger of the eight D triggers;

an output end of the frequency divider is connected to an input end of the D trigger array; and an output end of each D trigger of the eight D triggers is connected to the first clock signal output module, so as to output first clock signals.

5. The clock signal generator according to claim 4, wherein the first clock signal output module comprises:

multiple phase inverters with a gating function, wherein the multiple phase inverters are connected in a Pyramid structure, and each phase inverter receives the control signal preset in the subsystem, and when the control signal is in a high level, outputs a first clock signal received by an input end of the phase inverter.

6. The clock signal generator according to claim 1, wherein when the baud rate of data transmission in the subsystem is 10 MBaud:

the source clock signal generator is configured to generate eight source clock signals with a frequency of 1 Ghz according to the reference signal, wherein among the source clock signals, a phase interval between any two adjacent source clock signals is 125 ps;

correspondingly, the processor comprises a second frequency dividing module, wherein the second frequency dividing module performs selective beat processing on the eight source clock signals output by the source clock signal generator, and uses a second clock signal obtained after the beat processing as a synchronous clock signal with a 10MBaud data code stream in the subsystem.

7. The clock signal generator according to claim 6, wherein the second frequency dividing module is a 25/4 frequency dividing circuit, wherein the 25/4 frequency dividing circuit is configured to perform frequency dividing processing on 25 periods of five source clock signals with a frequency of 1 Ghz, and obtain second clock signals of four periods with a frequency of 160 Mhz.

8. The clock signal generator according to claim 1, wherein the source clock signal generator is a phase-lock loop circuit.

9. A chip, comprising a crystal oscillator generating a reference signal, and further comprising a clock signal generator, wherein the crystal oscillator is connected to an input end of a source clock signal generator of the clock signal generator, and is configured to provide a reference signal for the source clock signal generator;

the clock signal generator, applied to a physical layer subsystem supporting data transmission at multiple baud rates, comprises:

a source clock signal generator, and two or more processors connected to an output end of the source clock signal generator, wherein the source clock signal generator outputs multiple source clock signals with the same frequency according to a reference signal of a reference clock in the subsystem; and the processors perform frequency dividing processing on the multiple source clock signals through a digital logic circuit according to an oversampling technology, to obtain a synchronous clock signal corresponding to a baud rate of data transmission in the subsystem, so as to implement timing and transceiving functions when data is transmitted at the baud rate.

10. The clock signal generator according to claim 9, wherein when the baud rate of data transmission in the subsystem is 125 MBaud:

the source clock signal generator is configured to generate eight source clock signals with a frequency of 1 Ghz according to the reference signal, wherein among the source clock signals, a phase interval between any two adjacent source clock signals is 125 ps;

correspondingly, the processor comprises: a first frequency dividing module, and a first clock signal output module connected to the first frequency dividing module, wherein the first frequency dividing module performs beat processing on each source clock signal of the eight source clock signals output by the source clock signal generator to obtain 64 first clock signals, wherein each source clock signal corresponds to eight first clock signals, and a phase interval between any two adjacent first clock signals among the eight first clock signals is 1 ns; and the first clock signal output module selects, according to a control signal preset in the subsystem, a first clock signal from all the first clock signals obtained by the first frequency dividing module, and uses the selected first clock signal as a synchronous clock signal with a 125MBaud data code stream in the subsystem.

11. The clock signal generator according to claim 10, wherein the first frequency dividing module comprises:

eight eight-frequency dividing circuits connected in parallel, wherein each of the eight-frequency dividing circuit performs frequency dividing processing on a source clock signal that has a frequency of 1 Ghz and is output by the source clock signal generator, to obtain eight first clock signals with a frequency of 125 Mhz.

12. The clock signal generator according to claim 11, wherein each of the eight eight-frequency dividing circuits comprises:

a frequency divider and eight D triggers, wherein the eight D triggers are connected in series, and form a D trigger array; and a source clock signal output by the source clock signal generator is input into an input end of the frequency divider and a clock signal input end of each D trigger of the eight D triggers;

an output end of the frequency divider is connected to an input end of the D trigger array; and an output end of each D trigger of the eight D triggers is connected to the first clock signal output module, so as to output first clock signals.

13. The clock signal generator according to claim 12, wherein the first clock signal output module comprises:

multiple phase inverters with a gating function, wherein the multiple phase inverters are connected in a Pyramid structure, and each phase inverter receives the control signal preset in the subsystem, and when the control signal is in a high level, outputs a first clock signal received by an input end of the phase inverter.

14. The clock signal generator according to claim 9, wherein when the baud rate of data transmission in the subsystem is 10 MBaud:

the source clock signal generator is configured to generate eight source clock signals with a frequency of 1 Ghz according to the reference signal, wherein among the source clock signals, a phase interval between any two adjacent source clock signals is 125 ps;

correspondingly, the processor comprises a second frequency dividing module, wherein the second frequency dividing module performs selective beat processing on the eight source clock signals output by the source clock signal generator, and uses a second clock signal obtained after the beat processing as a synchronous clock signal with a 10MBaud data code stream in the subsystem.

15. The clock signal generator according to claim 14, wherein the second frequency dividing module is a 25/4 frequency dividing circuit, wherein the 25/4 frequency dividing circuit is configured to perform frequency dividing processing on 25 periods of five source clock signals with a frequency of 1 Ghz, and obtain second clock signals of four periods with a frequency of 160 Mhz.

16. The clock signal generator according to claim 9, wherein the source clock signal generator is a phase-lock loop circuit.

* * * * *